(12) United States Patent
Kienzle (10) Patent No.: US 6,756,599 B2
(45) Date of Patent: Jun. 29, 2004

(54) PARTICLE-OPTICAL APPARATUS, ILLUMINATION APPARATUS AND PROJECTION SYSTEM AS WELL AS A METHOD EMPLOYING THE SAME

(75) Inventor: Oliver Kienzle, Aalen (DE)

(73) Assignee: Carl Zeiss SMT AG (DE)

( * ) Notice: Subject to any disclaimer, the term of this patent is extended or adjusted under 35 U.S.C. 154(b) by 34 days.

(21) Appl. No.: 10/115,886

(22) Filed: Apr. 4, 2002

(65) Prior Publication Data

US 2002/0179845 A1 Dec. 5, 2002

(30) Foreign Application Priority Data

Apr. 5, 2001 (DE) .......................................... 101 17 025

(51) Int. Cl.[7] .............................. A61N 5/00; G21G 5/00
(52) U.S. Cl. .............................. 250/492.2; 250/492.22; 250/492.21; 250/492.23; 250/396 R
(58) Field of Search ....................... 250/492.23, 396 R, 250/492.22, 398, 397, 492.21

(56) References Cited

U.S. PATENT DOCUMENTS

| | | | |
|---|---|---|---|
| 4,376,249 A | * 3/1983 | Pfeiffer et al. | ........ 250/396 ML |
| 4,556,823 A | 12/1985 | Keller et al. | ............ 315/111.81 |
| 5,079,112 A | 1/1992 | Berger et al. | .................. 430/4 |
| 5,130,213 A | 7/1992 | Berger et al. | .................. 430/4 |
| 5,258,246 A | 11/1993 | Berger et al. | .................. 430/4 |
| 5,260,151 A | 11/1993 | Berger et al. | .................. 430/5 |
| 5,316,879 A | 5/1994 | Berger et al. | .................. 430/5 |
| 5,376,505 A | 12/1994 | Berger et al. | ............... 430/296 |
| 5,572,287 A | 11/1996 | Wangler et al. | ............... 355/53 |
| 5,633,507 A | 5/1997 | Pfeiffer et al. | ......... 250/492.23 |
| 5,646,715 A | 7/1997 | Wangler | ...................... 355/67 |

(List continued on next page.)

FOREIGN PATENT DOCUMENTS

| | | | |
|---|---|---|---|
| DE | 3138898 A1 | 4/1983 | |
| DE | 31 38 898 A1 | 4/1983 | ............. H01J/3/26 |

(List continued on next page.)

OTHER PUBLICATIONS

Abstract for Publication No. JP10172795, Publication Date Jun. 26, 1998, 1 page.

(List continued on next page.)

Primary Examiner—John R. Lee
Assistant Examiner—Erin-Michael Gill
(74) Attorney, Agent, or Firm—Rosenthal & Osha L.L.P.

(57) ABSTRACT

A particle-optical apparatus for changing trajectories of charged particles of a divergent particle beam oriented along a longitudinal axis is proposed, comprising:

an inner electrode arrangement which is at least partially transparent for the particles, engages at least partially around the longitudinal axis with a radial distance and extends along the longitudinal axis,
an outer electrode arrangement which engages at least partially around the inner electrode arrangement with a radial distance and extends along the longitudinal axis, and
a voltage source for providing a potential difference between the inner and the outer electrode arrangements, wherein the voltage source provides such a potential difference that a kinetic component of a particle traversing the inner electrode arrangement is reversible, said kinetic component being oriented orthogonally to the longitudinal axis.

Moreover, an illumination system and an imaging system as well as a manufacturing method employing said particle-apparatus are proposed.

17 Claims, 5 Drawing Sheets

U.S. PATENT DOCUMENTS

| | | | |
|---|---|---|---|
| 5,805,620 A | | 9/1998 | Liu et al. .................. 372/2 |
| 5,912,469 A | * | 6/1999 | Okino .................. 250/492.23 |
| 6,014,200 A | | 1/2000 | Sogard et al. .............. 355/53 |
| 6,040,576 A | | 3/2000 | Benner .................. 250/305 |
| 6,051,917 A | | 4/2000 | Nakasuji .................. 313/308 |
| 6,069,684 A | | 5/2000 | Golladay et al. ............ 355/53 |
| 6,091,187 A | | 7/2000 | Golladay et al. ........... 313/310 |
| 6,243,206 B1 | | 6/2001 | Wangler .................. 359/621 |
| 6,285,443 B1 | | 9/2001 | Wangler et al. ............ 355/67 |
| 6,437,353 B1 | | 8/2002 | Benner .................. 250/492.23 |

FOREIGN PATENT DOCUMENTS

| | | | | |
|---|---|---|---|---|
| DE | | 19520563 A1 | 12/1996 | |
| DE | | 195 20 563 A1 | 12/1996 | ............ G03F/7/20 |
| DE | | 197 38 070 A1 | 3/1999 | ............ H01J/7/05 |
| DE | | 19855106 A1 | 5/2000 | |
| DE | | 198 55 106 A1 | 5/2000 | ............ G03F/7/20 |
| DE | | 198 55 629 A1 | 6/2000 | ............ H01J/37/26 |
| EP | | 0953876 A2 | 11/1999 | ............ G03F/1/14 |
| EP | | 0969326 A2 | 1/2000 | ............ G03F/7/20 |
| JP | | 10-172795 | 6/1998 | ............ H05H/9/00 |
| SD | | 708844 | 9/1993 | |

OTHER PUBLICATIONS

X. Zhu et al.; "Comprehensive Analysis of Electron Optical Design of SCALPEL–HT/Alpha", 14 pages.

H.C. Pfeiffer et al.; "Projection Reduction Exposure with Variable Axis Immersion Lenses: Next Generation Lithography". J. Vac. Sci. Technol. B.; vol. 17, No. 6; Nov./Dec. 1999; pp. 1–6.

S.D.Golladay et al.;" A High Emittance Source for The PREVAIL Projection Lithography System"; J. Vac. Sci. Technology B.; vol. 17, No. 6; Nov./Dec. 1999; pp. 1–9.

M. Antl et al.; "Adjustable Multipole Elements"; Nuclear Instruments and Methods in Physics Research; A274 (1989); pp. 45–48.

J.A. Liddle et al.; "SCALPEL: A Projection Electron–Beam Approach to Sub–Optical Lithography"; Technology Review, Dec. 1999, 74 pages.

D. Moonen et al.; "Grid lens approach for h igh effective emittance in SCALPEL"; J. Vac. Sci. Technol. B, 18(6), Nov./Dec. 2000; pp. 3111–3114.

* cited by examiner

PARTICLE-OPTICAL APPARATUS, ILLUMINATION APPARATUS AND PROJECTION SYSTEM AS WELL AS A METHOD EMPLOYING THE SAME

FIELD OF THE INVENTION

The invention relates to a particle-optical apparatus for changing trajectories of charged particles of a beam of particles. Furthermore, the invention relates to an illumination apparatus and a projection system comprising such a particle-optical apparatus as well as a method for device manufacture. Such method comprises a photolithographic step in which the particle-optical apparatus is employed. In particular, the particle-optical apparatus is provided for use in an projection electron-beam lithographic system as well as for use in a method for device manufacture by means of projection electron-beam lithography.

BACKGROUND OF THE INVENTION

The so-called SCALPEL method (Scattering with Angular Limitation in Projection Electron-beam Lithography) is known as a method which employs a beam of electrons for imaging and exposing a radiation sensitive layer. This method is described in the white book "SCALPEL: A Projection Electron-Beam Approach to Sub-Optical Lithography", Technology Review, December 1999, by J. A. Liddle, Lloyd R. Harriott, A. E. Novembre and W. K. Waskiewicz, Bell Laboratories, Lucent Technologies, 600 Mountain Avenue, Murray Hill, N.J. 07974, USA. The entire disclosure of said document is incorporated in this description by reference. Furthermore, U.S. Pat. Nos. 5,079,112, 5,130,213, 5,260,151, 5,376,505, 5,258,246, 5,316,879 as well as European patent applications nos. 0,953,876 A2 and 0,969,326 A2 relate to the SCALPEL method. The entire disclosures of the above-mentioned patent documents are likewise incorporated in this description by reference.

A conventional projection lithographic system is used, for example, for the manufacture of a semiconductor device. Here, the structures to be formed on a semiconductor wafer are defined in a mask, the mask is illuminated by a beam of electrons and the structures defined on the mask are imaged onto the semiconductor wafer. The semiconductor wafer is provided with a radiation sensitive layer. After having been exposed by the electron beam, the radiation sensitive layer as well as the semiconductor wafer are subjected to further steps for forming the structures in the wafer material.

Figure 1:
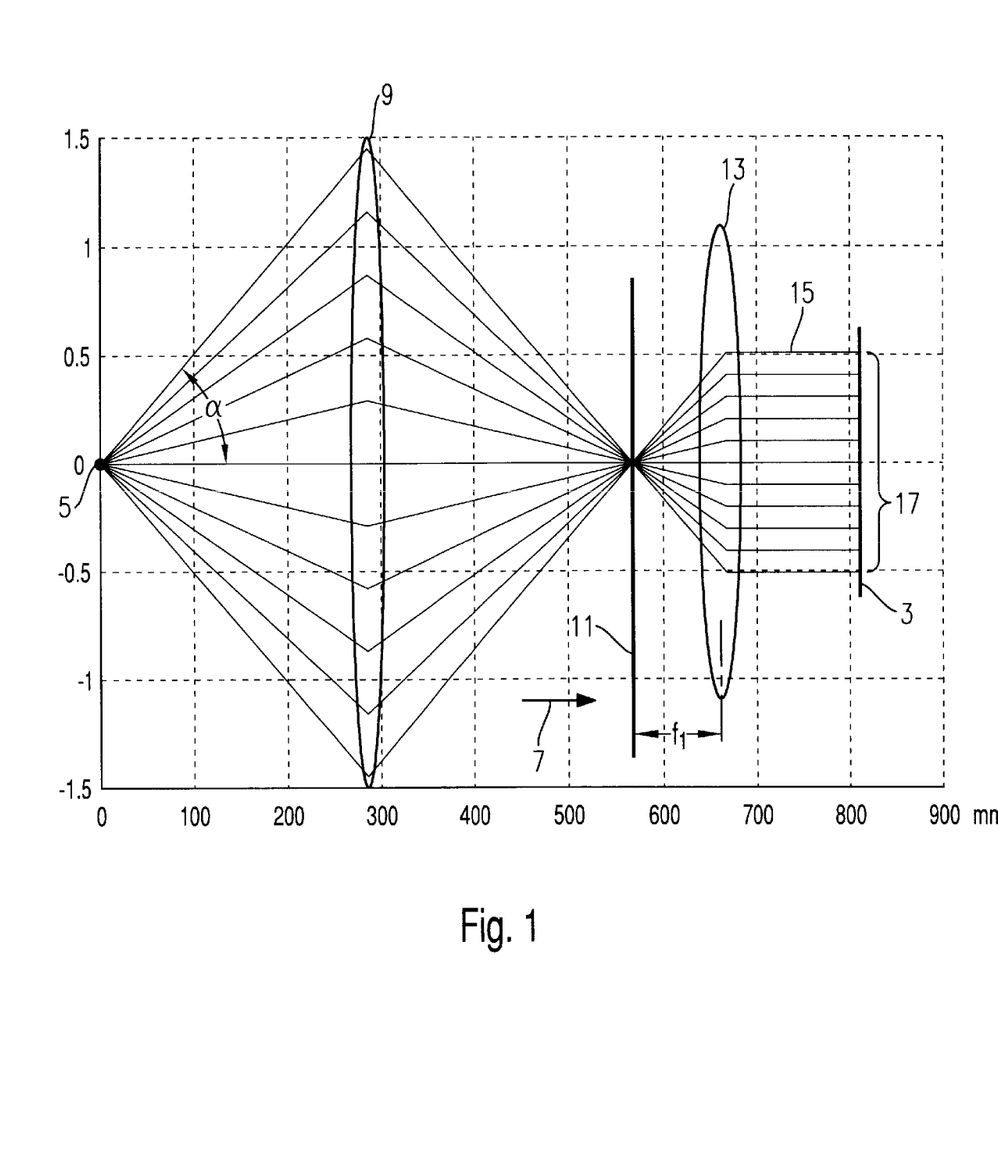
FIG. 1 shows an illumination apparatus, without a particle-optical apparatus according to the invention being provided in the beam path thereof.

FIG. 1 schematically shows an illumination apparatus for illuminating a mask 3 with charged particles. The charged particles are electrons which are emitted by an electron source 5 in a beam direction 7. The particle beam emitted by the source 5 exhibits little divergence which, for reasons of illustration, is, however, shown in FIG. 1 enlarged in size. A maximum angle $\alpha$ of the electrons with respect to the beam direction 7 is about 5 mrad.

The source is imaged by a first electron-optical focusing lens 9 into a front focal plane 11 of a second electron-optical focusing lens 13. The focusing lens 13 acts to shape the electrons divergently traversing the focal plane 11 such that a substantially parallel particle beam 15 with extended beam cross-section is formed in order to illuminate a field 17 on the mask 3 of a size of about 1 mm transverse to the beam direction 7.

The maximum illumination aperture which is attainable with this type of illumination is determined by the spatial dimension h of the source 5 transverse to the beam direction 7 as well as by the focal length $f_1$ of the lens 13. The maximum angle $\beta$ of the particles with respect to the beam direction 7, when the same impinge on the mask 3, is determined by $$\beta = \frac{h}{2 \cdot f_1}.$$

For small dimensions of the source 3 (FIG. 1 shows a dot-shaped source), the illumination aperture is thus low. However, a high illumination aperture is desirable in order to be able to transfer also small structures defined on the mask to the wafer with precision.

It is conceivable to increase the spatial dimension of the source transverse to the beam direction in order to increase the illumination aperture. However, it is problematic for sources of charged particles to increase the source dimension if the field illuminated on the mask is to be uniformly illuminated as well.

SUMMARY OF THE INVENTION

It is an object of the present invention to provide a particle-optical apparatus which contributes to the increase of an illumination aperture in a particle-optical illumination system.

Moreover, it is an object of the present invention to propose a particle-optical apparatus for changing trajectories of charged particles of a particle beam. In this respect, it is, in particular, an object of the invention to propose a particle-optical apparatus which selectively changes the trajectories of the charged particle, i.e., which acts only on trajectories of specific charged particles and not uniformly on the trajectories of all particles of a particle beam.

Furthermore, it is an object of the present invention to propose an illumination apparatus for illuminating a field which is to be illuminated and is spatially extended transverse to the beam direction with a comparatively high illumination aperture or/and comparatively uniformly.

Moreover, it is an object to propose a projection system, the illumination apparatus of which exhibits the above-mentioned advantages. It is a still further object of the invention to propose a method for manufacturing in particular miniaturized devices which enables the devices to be manufactured with increased precision.

To this end, the invention is based on the following consideration:

In an imaging illumination system, as it has been described above with reference to FIG. 1 by way of example, the light-transmitting value or emittance is a conservative quantity. This quantity is defined as the product of the square root of the illuminated area and the illumination divergence (numerical aperture). In an imaging illumination system, an increase of the illumination divergence is thus not achievable without decreasing the illuminated area. Therefore, the invention is based on the idea to develop a particle-optical apparatus which does not act as an imaging system but changes the trajectories of the charged particles traversing the particle-optical apparatus in a different way. The trajectories of different groups of particles are to be changed differently such that, all in all, an increase of the light transmitting value or emittance of the beam passing through the apparatus is achieved.

In particular, the invention proposes a particle-optical apparatus comprising two cylindrical electrode arrangements which are fitted into one another, said electrode arrangements being disposed relative to a particle beam entering the apparatus such that the beam direction is oriented approximately parallel to the direction of extension of at least one of the cylindrical electrodes. Moreover, an inner one of the two electrode arrangements is of such a length and has such a diameter that trajectories of at least those particles which enter the apparatus at an angle with respect to the beam axis which is larger than a minimum angle traverse the inner electrode arrangement radially with respect to the beam direction. To this end, the inner electrode arrangement is at least partially transparent for the charged particles. There is an electric potential difference between the inner electrode arrangement and the outer electrode arrangement such that a kinetic component of the particles traversing the inner electrode arrangement is reversed, said kinetic component being oriented transversely to the beam direction.

The inner and outer electrode arrangements together act like a cylindrical, internally mirrored tube which encloses the particle beam and reflects particles which want to escape from the interior of the cylinder back into the same.

For a group of particles of the particle beam which enter the apparatus with little divergence, the apparatus is preferably not effective, that is, this group of particles traverses the apparatus straightly, so that an observer positioned at the exit side of the apparatus perceives these particles as emerging from the particle source.

For another group of particles with increased divergence, the apparatus is preferably effective such that the particles are reflected once by the reflecting tube. The observer perceives this group of particles as emerging from a spatially distributed source which appears to be disposed beside the actual source.

For a still further group of particles with a still higher divergence, the apparatus is effective such that these particles are reflected twice or more by the reflecting tube so that the observer perceives this group of particles to emerge from further spatially distributed sources which appear to be spaced apart by a still greater distance from the actual source.

Accordingly, the effect of the apparatus of the invention is such that even a small radiation source is perceived by the observer as a radiation source which appears to have a substantially increased radiation emitting area.

If such a particle-optical apparatus is used in an illumination system, it contributes to an apparent increase of the spatial dimension of the radiation source transverse to the beam direction. This results into an increase of the light-transmitting value or emittance of the illumination system. For this reason, the apparatus of the invention also enables the illumination aperture to be increased for an illuminated field which is extended transverse to the beam direction.

Due to the potential difference between the inner electrode arrangement and the outer electrode arrangement, there is provided a space between these two electrode arrangements with an electric field therein which renders it possible to reverse the transversal kinetic component of the particles which enter said space. As this field is limited to the space between the inner electrode arrangement and the outer electrode arrangement, the charged particles must be enabled to enter this space. For this reason, the inner electrode arrangement is at least partially transparent for these particles. Preferably, this property of the inner electrode arrangement, namely partial transparency, is achieved in that the inner electrode arrangement is divided into a plurality of sub-electrodes which are spaced apart from one another. Preferably, the individual sub-electrodes are on a common equal electric potential, and a material-free space is provided between the sub-electrodes so that the particles pass through two adjacent sub-electrodes and can enter the space between the inner electrode arrangement and the outer electrode arrangement which provides the reflecting electric field. However, it is also possible that particles impinge directly on the sub-electrodes and thus cannot enter the space between inner and outer electrode.

In order to obtain a transparency as high as possible for the charged particles, the sub-electrodes preferably extend substantially parallel to the longitudinal axis of the apparatus or/and substantially parallel to the main direction of the particle beam entering the apparatus.

If the above-described particle-optical apparatus is employed in an illumination apparatus for illuminating an object, it acts there as an emittance changing apparatus which is preferably disposed between a particle source and the object plane. Preferably, such an illumination apparatus also comprises an imaging condenser system which is disposed between the emittance changing apparatus and the object and directs the particles emerging from the emittance changing apparatus to the object.

Preferably, the particles emitted by the particle source pass directly into the emittance changing apparatus. It is, however, also preferred to provide an optical system between the particle source and the emittance changing apparatus for producing an image of the source between the actual source and an entrance cross-section of the emittance changing apparatus.

Preferably, the condenser system comprises a focusing lens which images the source itself or the image of the source into an intermediate plane disposed between the emittance changing apparatus and the object plane. As a result, preferably several images of the source itself are produced in the intermediate plane if the first focusing lens images the source in the intermediate plane, and several images of the image of the source are produced if the first focusing lens images an image of the source in the intermediate plane. This plurality of images of the source or of the images of the source images are distributed in the intermediate plane, in particular, adjacent to one another.

However, it is also preferred that the first focusing lens does not produce an exact image of the source or of the source image in the intermediate plane. In this case, it is essential for the first focusing lens to direct the particles which have passed through the emittance changing apparatus in such a way through the intermediate plane that they are spaced apart in the intermediate plane from the longitudinal axis of the apparatus or the beam center by a distance which increases the more often the trajectory of a particle has been changed by the emittance changing apparatus. As compared to a situation in which the emittance changing apparatus is not disposed in the beam path, there is thus provided in the intermediate plane an extended illuminated area or an extended area which is traversed by particles. The particles traversing this extended area are directed to the object plane preferably by means of a second focusing lens such that in the object plane a field is illuminated which has a dimension in a direction transverse to the beam direction which is smaller than the dimension of the illuminated area in the intermediate plane. However, as compared to the situation in which the emittance changing apparatus is not disposed in the beam path, the illumination of this area in the object plane is then effected with an increased numerical aperture.

The invention also provides for a method for device manufacture, such devices being preferably highly miniaturized devices, such as micro-mechanical structures or integrated circuits. As far as integrated circuits are concerned, a mask includes a circuit pattern which corresponds to a single layer of the circuit to be formed on a suitable substrate, for example, a silicon wafer. In order to image the pattern onto a target area, also referred to as die, of the substrate, the latter is first covered with a radiation sensitive layer, also referred to as resist. Subsequently, the radiation sensitive layer is exposed or irradiated in that the pattern of the mask is imaged by means of charged particles, for example, electrons or ions, onto the radiation sensitive layer. The radiation sensitive layer is then developed and either the irradiated or exposed or the non-irradiated or unexposed regions of the irradiated layer are removed. The remaining structure of the radiation sensitive layer is then used as a mask, for example, in an etching step, an ion implantation step, a material deposition step or the like.

According to the invention, it is provided for that the mask and the structure which is defined on the mask and which is to be imaged onto the substrate are illuminated by the above-described illumination apparatus in a photolithographic step of the method.

Exemplary embodiments of the invention will be described below in further detail with reference to the accompanying drawings, wherein

DETAILED DESCRIPTION

Figure 2:
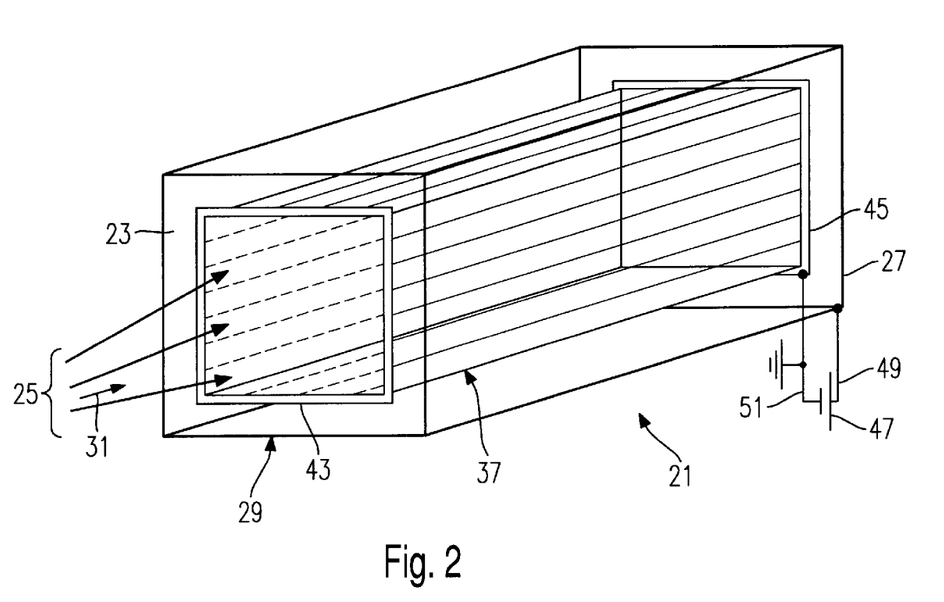
FIG. 2 is a schematic perspective view of an embodiment of a particle-optical apparatus of the invention.

An emittance changing apparatus 21 shown in FIG. 2 serves to change a beam 25 of charged particles entering on an entrance side 23 of the apparatus 21 such that the emittance of the beam is increased when the same emerges from an exit side 27 of the emittance changing apparatus 21 opposite to the entrance side 23.

A cylindrical outer electrode 29 extends between the entrance plane 23 and the exit plane 27, the cylinder direction and axis of symmetry 35 of said outer electrode coinciding with a direction 31 of the beam 25. The outer electrode 29 is formed by four plate electrodes 33 which are disposed in pairs orthogonally to one another, said plate electrodes being disposed spaced apart from the longitudinal axis 35 at equal distance. Each of the plate electrodes 33 is formed of a material which is electrically conductive all-over.

The emittance changing apparatus 21 further includes an inner electrode arrangement 37 comprised of a plurality of wires 39 each extending parallel to the longitudinal axis 35. The wires 39 are disposed within the hollow space formed by the plates 33, each wire 39 being spaced apart from a directly adjacent plate 33 by a distance of d=0.2 mm. The wires 39 are thus disposed on four planes 41 each extending parallel to a respective plate 33, each plane 41 being spaced apart from the longitudinal axis 35 by a distance of D=0.5 mm. The wires 39 are tightened between a frame mount 43 disposed on the entrance side 23 and a frame mount 45 disposed on the exit side 27 and electro-conductively connected to same.

The emittance changing apparatus 21 further comprises a voltage source 47 which is connected, through a line 49, to the outer electrode arrangement 29, on the one hand, and, through a line 51 via one of the frame mounts 43, 45, to the inner electrode arrangement 37, on the other hand, the inner electrode arrangement 37 being on ground potential. The voltage source 47 produces a potential difference of 10 V between the inner electrode arrangement 37 and the outer electrode arrangement 29 so that the outer electrode arrangement 29 has a potential of =10V as compared to ground.

Figure 3:
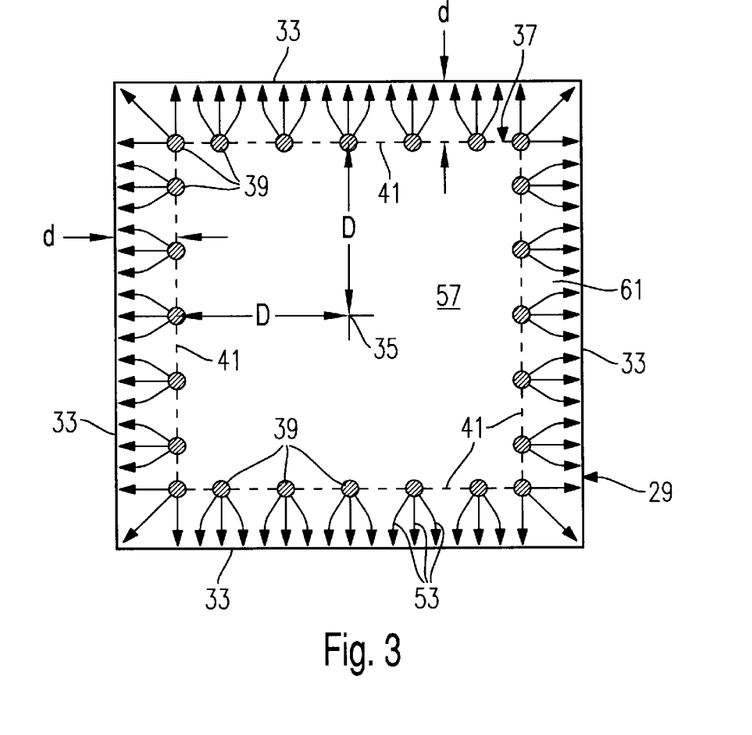
FIG. 3 is a cross-sectional view of the particle-optical apparatus according to FIG. 1.

Accordingly, an electric field is produced in a space 61 between the inner electrode arrangement and the outer electrode arrangement, the shape of this field being schematically indicated by field lines 53 in FIG. 3. The effect which the latter has on a space 57 inside the inner electrode arrangement 37 is that of a Faraday cage so that there is substantially no field in this space.

Figure 4:
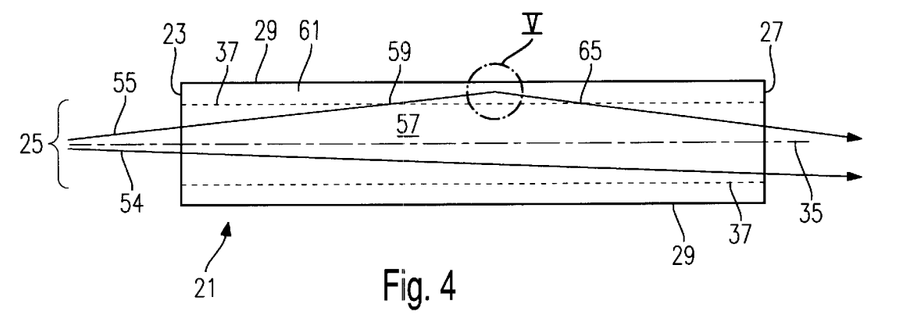
FIG. 4 is a view reflecting the function of the apparatus shown in FIGS. 2 and 3.
Figure 5:
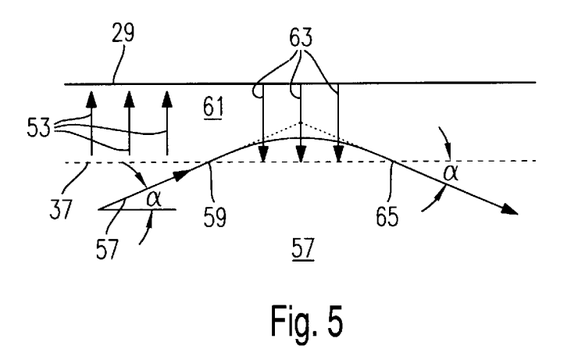
FIG. 5 is an enlarged view of a section indicated by reference sign V in FIG. 4, FIG. 6, is a further illustrative view reflecting the function of the apparatus shown in FIGS. 2 and 3.

FIG. 4 shows two trajectories 54 and 55 of electrons of the beam 25 which traverse the emittance changing apparatus 21. When entering the apparatus 21, the trajectory 54 has a small divergence or angle with respect to the central axis 35 and thus extends entirely in the inner space 57 and, accordingly, it traverses the apparatus 21 straightly. In contrast to that, the trajectory 55, when entring the apparatus 21, extends at a larger angle with respect to the longitudinal axis 35 so that it penetrates the inner electrode arrangement 37 at a location 59 in that the corresponding electron flies through adjacent wires 39 and enters the space between inner electrode 37 and outer electrode 29. This is shown in enlarged view in FIG. 5. Due to the electric field present in the space 61 (see field lines 53), a force which is directed opposite to the field lines 53 acts on the electron, which force is indicated in FIG. 5 by arrows 63. This force 63 reduces a kinetic component oriented transversely to the longitudinal axis 35 of the electron moving in the space 61 and, eventually, reverses the kinetic component oriented transversely to the longitudinal axis 35 which was present when the electron entered the space 61 at the location 59, so that the electron leaves the space 61 again at a location 65 in that it flies through two wires 39 of the inner electrode arrangement 37 and returns into the inner space 57 in which there is no field and further moves straightly in the same and emerges from the emittance changing apparatus 21 at the exit side 27 thereof. The space 61 between the inner electrode and the outer electrode thus acts on an electron traversing the inner electrode 37 like a plane mirror.

Figure 6:
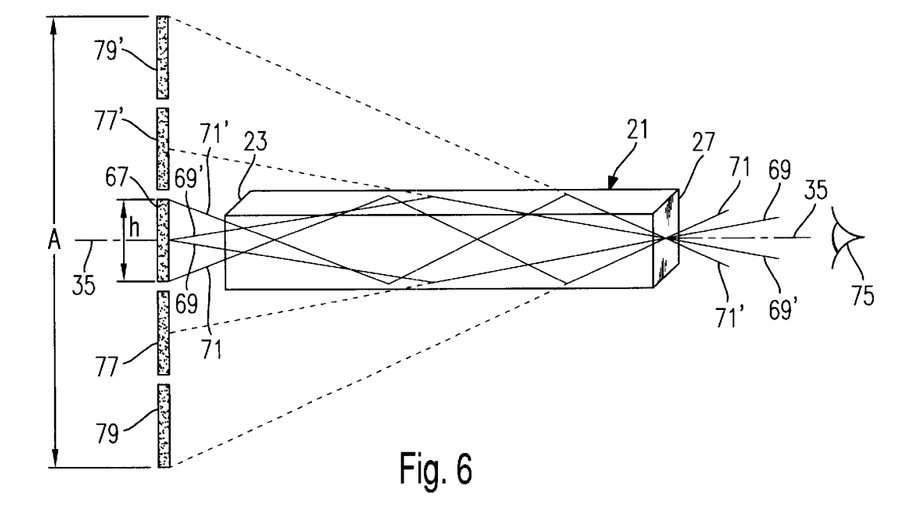

FIG. 6 shows a particle source 67 disposed concentrically with respect to the central axis 35 of the emittance changing apparatus 21 and spaced apart from the entrance plane 23 of the apparatus 21, said particle source having a dimension h transverse to the longitudinal axis 35. FIG. 6 further shows, by way of example, a plurality of trajectories for electron paths, namely two trajectories 69 and 69' which extend at such an angle with respect to the longitudinal axis 35 that electrons are reflected once by the electrode arrangements. Furthermore, two trajectories 71 and 71' are shown which extend at a larger angle with respect to the longitudinal axis 35, so that the respective electrons are reflected twice by the electrode arrangements. Viewed from the eye of an observer 75 positioned, in beam direction, behind the exit end 27 of the apparatus 21, the electrons moving on the trajectories 69, 69', 71 and 71' appear to emerge from virtual beam sources 77, 77', 79 and 79', respectively, which are disposed off-set in the direction transverse to the longitudinal axis 35 beside the actual beam source 67. Here, the virtual sources 79 79' which are produced by the trajectories 71 and 71', respectively, and are reflected twice by the apparatus 21 are disposed further away from the longitudinal axis 35 than the virtual sources 77 and 77' which are produced by the trajectories 69 and 69', respectively, and are merely reflected once by the apparatus 21.

Accordingly, from the point of view of the observer 75, the emittance changing apparatus 21 acts such that, all in all, the observer perceives radiation which appears to emerge from a radiation source which has a dimension A transverse to the longitudinal axis 35. In the example illustrated in FIG. 6, wherein, due to the limited beam divergence, maximally two reflections occur in the emittance changing apparatus 21, said dimension A is five times as large as the dimension h of the actual source 67. Here, the divergence, that is, the angle from the longitudinal axis 35 or the angular spread of the beams emerging from the exit end 27 of the apparatus 21, as compared to the entry of the beams at the entrance end 23, is not changed by the apparatus 21. As, however, the apparent area of the source is increased by the apparatus 21, the apparatus 21 has increased the light transmitting value or the emittance of the beam which is defined as the product of the square root of the illuminated area and the illumination divergence.

Figure 7:
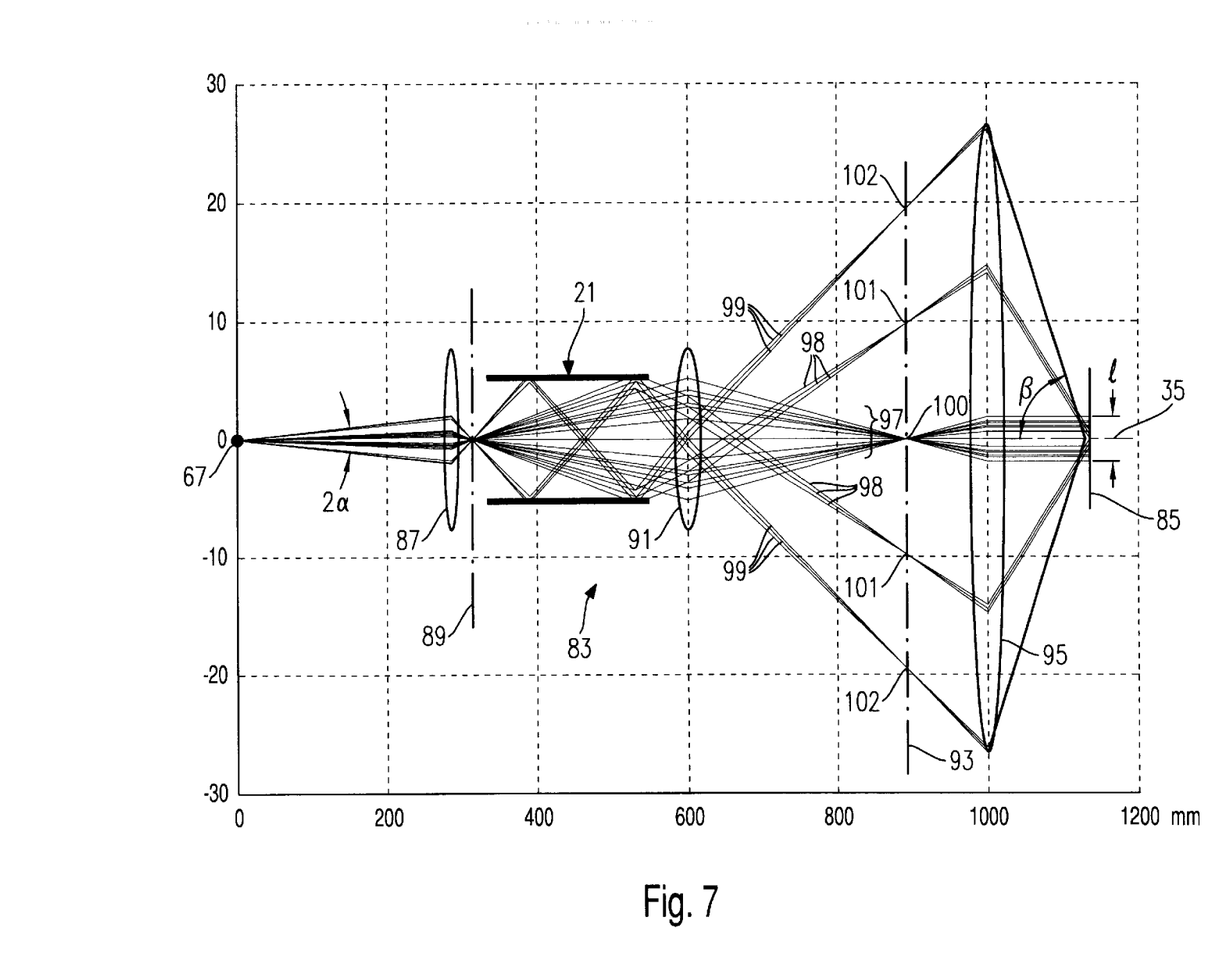
FIG. 7 is an embodiment of an illumination system according to the invention and FIG. 8 is a partial view of an embodiment of a projection system according to the invention.

FIG. 7 shows an embodiment of an illumination system 83 in which the emittance changing apparatus 21 is integrated. The longitudinal axis 35 of the emittance changing apparatus 21 is oriented such that it coincides with the optical axis of the illumination system 83.

The illumination system 83 is part of a lithography system which, furthermore, comprises a projection system 84 which is described in further detail herein below with reference to FIG. 8. Here, an illuminated object 85 is a mask having patterns defined thereon which are projected onto a radiation sensitive layer 105 of a semiconductor wafer 107 by means of the projection system 84. The radiation source 67 is a thermal electron source, wherein the electrodes emitted by the cathode heated up to about 2000 K are accelerated by a voltage of about 100 kV in the direction of the optical axis 35. The kinetic energy of the electrons in the direction of the axis 35 is thus 100 keV, while the kinetic energy perpendicular to the axis 35 has a maximum of about 0.2 eV. A maximum angle α which the trajectory of an electron emitted by the source 67 maximally assumes with respect to the optical axis 35 is thus about 1.4 mrad.

A focusing lens 87 produces an image of the source 67 in a plane 89 reduced in size by a factor of ten. A further focusing lens 91 is disposed on the optical axis such that it images the image of the source 67 in the plane 89 into an intermediate image plane 93. Between the plane 89 and the focusing lens 91, there is disposed the emittance changing apparatus 21 which has a length of 200 mm in the direction of the optical axis 35 and an edge length of about 10 mm*10 mm transverse thereto.

The intermediate image plane 93 is imaged by a third focusing lens 95 to infinity. FIG. 7 merely shows some exemplary trajectories of electrons on their way from the source 67 to the mask 85. A group 97 of the trajectories shown in FIG. 7 belongs to the electrons which are emitted by the source 67 at an angle α with respect to the axis 35 which is so small that they traverse the emittance changing apparatus 21 without reflection. For these electrons, the focusing lens 91 produces an intermediate image 100 of the source 67 in the intermediate plane 93 which is disposed on the longitudinal axis 35. These trajectories are rendered parallel by the focusing lens 95 so that, when they impinge on the mask 85, they enclose a very small angle β with respect to the axis 35.

A further group 98 of trajectories belongs to those electrons which are emitted by the source 67 in such a range of the angle α with respect to the axis 35 that they are reflected once in the emittance changing apparatus 21. For these electrons, the focusing lens 91 produces an intermediate image 101 in the intermediate image plane 93 which is spaced apart from the optical axis 35. The focusing lens 95 also directs these electrons onto the mask 85, where they overlap with the electrons of the bundle 97, but impinge on the mask at a considerably larger angle β with respect to the axis 35.

A still further group 99 of trajectories belongs to the electrons which are emitted by the source 67 at an almost maximum emittance angle α. These electrons are reflected twice in the emittance changing apparatus 21, and the focusing lens 91 produces for these electrons an image 102 of the image of the source 67 in the plane 89. These images 102 of the source 67 produced after dual reflection in the emittance changing apparatus 21 are spaced apart from the optical axis 35 by a still larger distance than the images 101 of the electrons which have only been reflected once in the emittance changing apparatus 21.

The images 102, too, are directed by the focusing lens 95 as a substantially parallel bundle of beams onto the mask 85 where they overlap with the electrons of the bundles 97 and 98 and impinge on the mask 85 at a still larger angle β with respect to the axis 35.

Here, the angle β at which the last-mentioned group 99 of trajectories extends with respect to the longitudinal axis 35 constitutes the maximum illumination aperture and is considerably larger than the maximum angle of divergence α of the source 67, although a quadratic field having an edge length l of about 1 mm is illuminated on the mask 85. Despite its relative large dimensions as compared to the dimensions of the source 67, this field is illuminated substantially homogeneously. It is also apparent from FIG. 7 that the edge length l of the illuminated field is smaller than the distance of the intermediate images 101 and 102 from the longitudinal axis 35.

Figure 8:
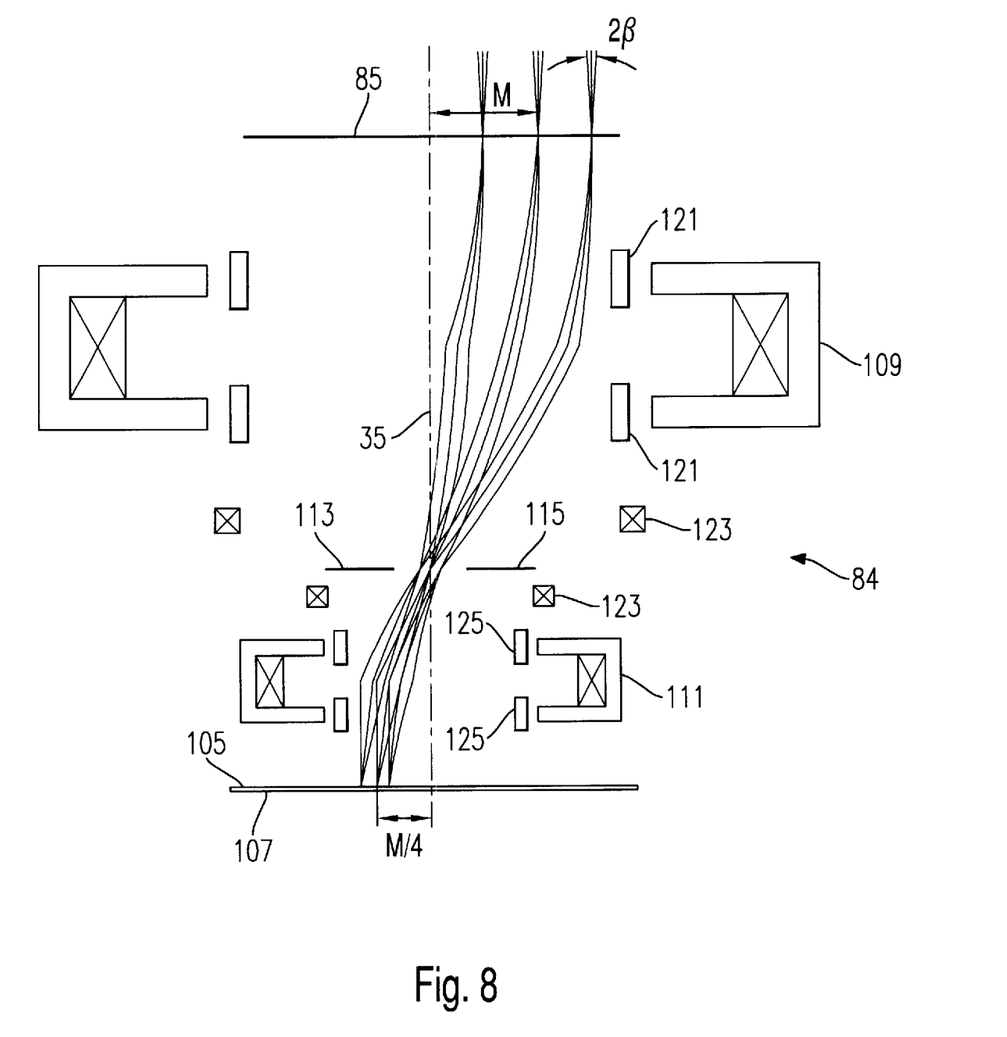

The projection system 84 shown in FIG. 8 images the mask 85 onto a radiation sensitive layer 105 which is applied to the semiconductor wafer 107 on the side facing the mask 85. To this end, the projection system 84 comprises a doublet of magnetic lenses 109 and 111 which images structures and patterns defined on the mask onto the radiation sensitive layer 105 reduced in size by a factor of four. FIG. 8 shows three exemplary groups of trajectories with a different distance M from the optical axis 35. It is also apparent from FIG. 8 that the mask 85 is illuminated by the illumination system 35 shown in FIG. 7 with an illumination aperture β.

The doublet of focusing lenses 109 and 111 guides trajectories through a symmetry plane 113 where a crossover is formed for the beams, that is, the trajectories intersect the optical axis 35 at this location. In this symmetry plane 113, there is also provided an aperture filter 115 which is traversed by the beams which have traversed the mask 85 unscatteredly, while the electrons which are slightly deflected from their original path by the mask 85 are absorbed by the filter 115 and thus do not reach the radiation sensitive layer.

In FIG. 8, the reference numbers 121, 123 and 125 designate secondary coils which provide magnetic fields in addition to the focusing lenses 109 and 111 and can be driven such that aberrations are reduced when the mask 85 is projected onto the radiation sensitive layer 105.

In the above-described embodiments, the emittance changing apparatus was used in an illumination system and a projection system which serves to image a mask structure onto a substrate. However, the emittance changing apparatus 21 is not limited to such an application. It can be employed whenever trajectories of charged particles are to be influenced, the effect or the change of the trajectories being dependent upon an angle of the trajectories with respect to an optical axis prior to their entry into the emittance changing apparatus.

Moreover, the emittance changing apparatus has been described above to comprise an inner electrode arrangement and an outer electrode arrangement, each having a quadratic cross-section. However, other geometries are conceivable in this respect as well. In particular, the inner and outer electrode arrangements can be of circular cylindrical shape or any other shape.

The arrangement of the cylindrical electrode arrangement of the emittance changing apparatus has been described above as being symmetric with respect to the incident beam. However, it is also possible to provide an angle between incident beam and longitudinal cylinder axis or to shift the longitudinal cylinder axis parallel to the incident beam.

In the embodiment described in FIG. 7, an image of the source is formed by the condenser system in the intermediate image plane. However, it is also possible to image the source itself into the intermediate image plane.

In the above embodiments, the sub-electrodes of the emittance changing arrangement have been described as tightened wires. Alternatively, it is also possible to provide the sub-electrodes by other measures. One possibility in this respect is to lithographically produce the sub-electrodes in that the recesses between adjacent sub-electrodes are etched from a solid material in an etching process.

What is claimed is:

1. A particle-optical apparatus for changing trajectories of charged particles of a divergent particle beam oriented along a longitudinal axis, comprising:
   an inner electrode arrangement which is at least partially transparent for the particle, extends at least partially around the longitudinal axis with a first radial distance therefrom and extends along the longitudinal axis,
   an outer electrode arrangement which extends relative to the longitudinal axis at least partially around the inner electrode arrangement with a second radial distance therefrom and extends along the longitudinal axis; and
   a voltage source for providing a potential difference between the inner electrode arrangement and the outer electrode arrangement, wherein the voltage source provides such a potential difference that a kinetic component of a particle traversing the inner electrode arrangement is reversible, said kinetic component being oriented transversely to the longitudinal axis.

2. The apparatus of claim 1, wherein the inner electrode arrangement comprises a plurality of sub-electrodes disposed spaced apart from each other in circumferential direction around the longitudinal axis.

3. The apparatus according to claim 2, wherein the sub-electrodes are formed by a plurality of wires which are tightened between a mounting frame for the wires on the entrance side and a mounting frame for the wires on the exit side.

4. The apparatus according to claim 2, wherein the sub-electrodes extend substantially parallel to the longitudinal axis.

5. The apparatus according to claim 4, wherein the sub-electrodes are formed by a plurality of wires which are tightened between a mounting frame for the wires on the entrance side and a mounting frame for the wires on the exit side.

6. A particle-optical illumination apparatus for illuminating an object disposed in an object plane, comprising:
   a particle source for emitting a beam of charged particles,
   an emittance changing apparatus disposed between the particle source and the object plane which is formed by a particle-optical apparatus into which charged particles enter which are emitted by the particle source, wherein the particle-optical apparatus for changing trajectories of charged particles of a divergent particle beam oriented along a longitudinal axis comprising:
   an inner electrode arrangement which is at least partially transparent for the particles, extends at least partially around the longitudinal axis with a first radial distance therefrom and extends along the longitudinal axis,
   an outer electrode arrangement which extends relative to the longitudinal axis at least partially around the inner electrode arrangement with a second radial distance therefrom and extends along the longitudinal axis; and
   a voltage source for providing a potential difference between the inner electrode arrangement and the outer electrode arrangement,
   wherein the voltage source provides such a potential difference that a kinetic component of a particle traversing the inner electrode arrangement is reversible, said kinetic component being oriented transversely to the longitudinal axis; and
   a condenser system for directing particles emerging from the emittance changing apparatus onto the object plane.

7. The illumination apparatus according to claim 6, wherein at least a third focusing lens is provided between the source and the emittance changing apparatus for producing the image of the source imaged by the first focusing lens into the intermediate plane.

8. The illumination apparatus according to claim 6, wherein the condenser system comprises a first focusing lens which images the source or an image of the source disposed in a source image plane into an intermediate plane, wherein the emittance changing apparatus is disposed between the source or the source image plane and the first focusing lens, and wherein several images of the source or the image of the source are produced in the intermediate image plane.

9. The illumination apparatus according to claim 8, wherein at least a third focusing lens is provided between the source and the emittance changing apparatus for producing the image of the source imaged by the first focusing lens into the intermediate plane.

10. The illumination apparatus according to claim 8, wherein the condenser system comprises a second focusing lens for superposing the plurality of images of the source or of the image of the source in the object plane.

11. The illumination apparatus according to claim 10, wherein at least a third focusing lens is provided between the source and the emittance changing apparatus for producing the image of the source imaged by the first focusing lens into the intermediate plane.

12. The illumination apparatus according to claim 10 wherein the intermediate plane is a focal plane of the second focusing lens.

13. The illumination apparatus according to claim 12 wherein at least a third focusing lens is provided between the source and the emittance changing apparatus for producing the image of the source imaged by the first focusing lens into the intermediate plane.

14. The illumination apparatus according to claim 6, wherein the condenser system comprises a first focusing lens for guiding the particles, after the same have traversed the emittance changing apparatus, through an intermediate plane disposed between the object plane and the first focusing lens such that each particle traverses the intermediate plane spaced apart from the longitudinal axis by a distance which increases the more often the kinetic component of the particle oriented orthogonally to the longitudinal axis has been changed by the emittance changing apparatus.

15. The illumination apparatus according to claim 14, wherein the condenser system comprises a second focusing lens for guiding the particles to the object plane after the same have traversed the intermediate plane, a maximum distance from the longitudinal axis at which the particles impinge on the object plane being less than a maximum distance at which the corresponding particles traverse the intermediate plane.

16. An imaging system for transferring a pattern defined on a mask onto
a particle-sensitive substrate disposable in a substrate plane by means of a beam
of charged particles, comprising:
an illumination system for illuminating the mask with a beam of charged particles and a particle-optical imaging apparatus for imaging the mask onto the substrate,
the mask (85) being disposed in the object plane thereof; and wherein the illumination system comprises:
a particle source for emitting a beam of charged particles,
an emittance changing apparatus disposed between the particle source and the object plane which is formed by a particle-optical apparatus into which charged particles enter which are emitted by the particle source, wherein the particle-optical apparatus for changing trajectories of charged particles of a divergent particle beam oriented along a longitudinal axis comprising:
an inner electrode arrangement which is at least partially transparent for the particles, extends at least partially around the longitudinal axis with a first radial distance therefrom and extends along the longitudinal axis,
an outer electrode arrangement which extends relative to the longitudinal axis at least partially around the inner electrode arrangement with a second radial distance therefrom and extends along the longitudinal axis; and
a voltage source for providing a potential difference between the inner electrode arrangement and the outer electrode arrangement,
wherein the voltage source provides such a potential difference that a kinetic component of a particle traversing the inner electrode arrangement is reversible, said kinetic component being oriented transversely to the longitudinal axis; and
a condenser system for directing particles emerging from the emittance changing apparatus onto the object plane.

17. A method for device manufacture, comprising at least one photolithographic step, wherein the photolithographic step comprises:
providing an imaging system for transferring a pattern defined on a mask onto a particle-sensitive substrate disposable in a substrate plane by means of a beam of charged particles, the imaging system comprising:
an illumination system for illuminating the mask with a beam of charged particles and a particle-optical imaging apparatus for imaging the mask onto the substrate, the mask being disposed in the object plane thereof; and
wherein the illumination system comprises:
a particle source for emitting a beam of charged particles;
an emittance changing apparatus disposed between the particle source and the object plane which is formed by a particle-optical apparatus into which charged particles enter which are emitted by the particle source, wherein the particle-optical apparatus for changing trajectories of charged particles of a divergent particle beam oriented along a longitudinal axis comprising:
an inner electrode arrangement which is at least partially transparent for the particles, extends at least partially around the longitudinal axis with a radial distance therefrom and extends along the longitudinal axis;
an outer electrode arrangement which extends relative to the longitudinal axis at least partially around the inner electrode arrangement with a radial distance therefrom and extends along the longitudinal axis; and
a voltage source for providing a potential difference between the inner electrode arrangement and the outer electrode arrangement,
wherein the voltage source provides such a potential difference that a kinetic component of a particle traversing the inner electrode arrangement is reversible, said kinetic component being oriented transversely to the longitudinal axis; and
a condenser system for directing particles emerging from the emittance changing apparatus onto the object plane;
disposing a substrate having applied thereon a particle-sensitive layer in the substrate plane; and
exposing the particle-sensitive substrate by means of the projection system, whereby a pattern provided by the mask is transferred to the particle-sensitive layer.

* * * * *

UNITED STATES PATENT AND TRADEMARK OFFICE
CERTIFICATE OF CORRECTION

PATENT NO. : 6,756,599 B2
APPLICATION NO. : 10/115886
DATED : June 29, 2004
INVENTOR(S) : Oliver Kienzle Page 1 of 2

It is certified that error appears in the above-identified patent and that said Letters Patent is hereby corrected as shown below:

On Sheet 2 of 5 please replace existing drawing with the attached formal replacement drawing.

In Column 6, line 23, please replace "=10V" with -- -10V --.

In Column 6, line 37, please replace the word "entring" with -- entering --.

In Claim 16, line 39, please delete referenced number "(85)".

Signed and Sealed this

Third Day of October, 2006

JON W. DUDAS
*Director of the United States Patent and Trademark Office*

Fig. 2

Fig. 3